(12) United States Patent
Liu et al.

(10) Patent No.: US 10,254,661 B2
(45) Date of Patent: Apr. 9, 2019

(54) SILICON WAFER TRANSPORTATION SYSTEM

(71) Applicant: SHANGHAI MICRO ELECTRONICS EQUIPMENT (GROUP) CO., LTD., Shanghai (CN)

(72) Inventors: Kai Liu, Shanghai (CN); Songli Hu, Shanghai (CN); Jie Jiang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/576,070

(22) PCT Filed: May 20, 2016

(86) PCT No.: PCT/CN2016/082790
§ 371 (c)(1),
(2) Date: Nov. 21, 2017

(87) PCT Pub. No.: WO2016/188371
PCT Pub. Date: Dec. 1, 2016

(65) Prior Publication Data
US 2018/0143541 A1 May 24, 2018

(30) Foreign Application Priority Data
May 24, 2015 (CN) .......................... 2015 1 0270081

(51) Int. Cl.
*G03B 27/42* (2006.01)
*G03B 27/58* (2006.01)
(Continued)

(52) U.S. Cl.
CPC ........ *G03F 7/70733* (2013.01); *B25J 9/0087* (2013.01); *B25J 9/0096* (2013.01);
(Continued)

(58) Field of Classification Search
CPC .......... H01L 21/67742; H01L 21/6719; H01L 21/68707; H01L 21/67196;
(Continued)

(56) References Cited

U.S. PATENT DOCUMENTS 5,539,266 A * 7/1996 Stevens ................ H02K 49/106
310/103
5,800,018 A * 9/1998 Colombo ............... B60N 2/882
297/395
(Continued)

FOREIGN PATENT DOCUMENTS

CN 1261820 C 6/2006
CN 101158866 A 4/2008
(Continued)

*Primary Examiner* — Mesfin T Asfaw
(74) *Attorney, Agent, or Firm* — Muncy, Geissler, Olds & Lowe, P.C.

(57) ABSTRACT

A wafer transfer system for use in a photolithography system including a wafer storage apparatus, a pre-alignment apparatus, a buffer stage and a wafer stage is disclosed, which includes: a dual-arm robot, configured to take a wafer to be exposed from the wafer storage apparatus and transfer it onto the pre-alignment apparatus and further configured to remove an exposed wafer from the buffer stage and place it back into the wafer storage apparatus; a wafer-loading linear robot, configured to transfer a pre-aligned wafer onto the wafer stage; and a wafer-unloading linear robot, configured to transfer the exposed wafer onto the buffer stage. The dual-arm robot, the wafer-loading linear robot and the wafer-unloading linear robot can operate in parallel so as to achieve time savings in the wafer transfers.

7 Claims, 11 Drawing Sheets

(51) Int. Cl.
*G03F 7/20* (2006.01)
*G03F 9/00* (2006.01)
*B25J 9/00* (2006.01)
*B25J 9/04* (2006.01)
*B25J 11/00* (2006.01)
*B25J 15/00* (2006.01)
*B25J 15/06* (2006.01)
*H01L 21/677* (2006.01)
*H01L 21/687* (2006.01)

(52) U.S. Cl.
CPC .......... *B25J 9/041* (2013.01); *B25J 11/0095* (2013.01); *B25J 15/0014* (2013.01); *B25J 15/0683* (2013.01); *G03F 7/20* (2013.01); *G03F 9/00* (2013.01); *H01L 21/67742* (2013.01); *H01L 21/67745* (2013.01); *H01L 21/67766* (2013.01); *H01L 21/67769* (2013.01); *H01L 21/68707* (2013.01); *Y10S 901/17* (2013.01); *Y10S 901/23* (2013.01); *Y10S 901/40* (2013.01)

(58) Field of Classification Search
CPC ......... H01L 21/67201; H01L 21/67207; H01L 21/67303; H01L 21/6732; H01L 21/67369; H01L 21/67754; H01L 21/67766; H01L 21/0274
See application file for complete search history.

(56) References Cited

U.S. PATENT DOCUMENTS

| | | | |
|---|---|---|---|
| 7,604,449 | B1 | 10/2009 | Kaveh |
| 2003/0082466 | A1* | 5/2003 | del Puerto .............. G03F 7/707 430/22 |
| 2005/0006230 | A1* | 1/2005 | Narushima ....... H01L 21/67017 204/298.2 |

FOREIGN PATENT DOCUMENTS

| | | |
|---|---|---|
| CN | 102347261 A | 2/2012 |
| CN | 103424991 A | 12/2013 |
| CN | 103424991 A | 12/2013 |
| CN | 103531502 A | 1/2014 |
| CN | 103824797 A | 5/2014 |
| CN | 103824797 A | 5/2014 |
| CN | 103984208 A | 8/2014 |
| CN | 103984208 A | 8/2014 |
| CN | 204303792 U | 4/2015 |
| JP | 2008028179 A | 2/2008 |
| JP | 2008028179 A | 2/2008 |
| KR | 20070005796 A | 1/2007 |
| KR | 20070005796 A | 1/2007 |
| TW | I394224 B | 4/2013 |
| TW | 201334932 A | 9/2013 |
| TW | M481113 U | 7/2014 |
| TW | I478272 B | 3/2015 |

* cited by examiner

SILICON WAFER TRANSPORTATION SYSTEM

TECHNICAL FIELD

The present invention relates to photolithography tools, and in particular, to a wafer transfer system.

BACKGROUND

The development of microelectronics technology is promoting the upgrading of computer technology, communication technology and other electronic information technology. Therefore, microelectronics technology plays an important leading and fundamental role in the information industry revolution. Photolithography tools are indispensable for the fabrication of microelectronic devices.

In order to reduce the cost of chip manufacturing, users' demand for photolithography tools with higher yields is increasing. Driven by the market and interests, manufacturers of photolithography tools are also seeking for yield improvements. At the same time, in order to meet different needs of the market, photolithography tools are required to be able to handle wafers of various sizes.

For yield improvement of a photolithography tool, it is important to increase the yield of its wafer transfer system. Before the exposure of a wafer carried on a wafer stage has been completed, it is necessary for the wafer transfer system to get a new wafer ready to be fed onto the wafer stage. Therefore, the wafer transfer yield must be higher than the overall yield of the photolithography tool.

In general terms, the wafer transfer yield can be enhanced by 1) continuously improving the speed, acceleration, stability duration and other motion properties of a robot for wafer transfer, or 2) optimizing the configuration of the wafer transfer system, i.e., the layout of a pre-alignment apparatus, the robot and other involved components. However, currently, the manufacturers rely only on enhancement of robot motion properties for increasing the yields of their photolithography tools.

SUMMARY OF THE INVENTION

The present invention solves the slow wafer transfer rate problem with the existing photolithography tools by presenting a wafer transfer system.

To this end, the present invention provides a wafer transfer system for use in a photolithography system comprising a wafer storage apparatus, a pre-alignment apparatus, a buffer stage and a wafer stage, wherein the wafer transfer system comprises: a dual-arm robot, configured to take a wafer to be exposed from the wafer storage apparatus and transfer the wafer to be exposed onto the pre-alignment apparatus and further configured to remove an exposed wafer from the buffer stage and place the exposed wafer back into the wafer storage apparatus; a wafer-loading linear robot, configured to transfer a pre-aligned wafer onto the wafer stage; and a wafer-unloading linear robot, configured to transfer the exposed wafer onto the buffer stage.

Preferably, the dual-arm robot may comprise: a main body as well as a wafer loading arm and a wafer unloading arm both in movable connection with the main body.

Preferably, each of the wafer-loading linear robot and the wafer-unloading linear robot may comprise a fork, a linear motor and a slider, wherein the fork is connected to a moveable end of the linear motor via the slider.

Preferably, the linear motor may comprise a linear motor stator, a slide rail and a linear motor mover, wherein the slide rail is provided on the linear motor stator, and wherein the linear motor mover is configured to drive the slider, and hence the fork to move along the slide rail.

Preferably, the fork may comprise a connecting arm in fixed connection with the slider, a connecting member in fixed connection with the connecting arm, and two wafer carrying blades symmetrically arranged and both fixed to the connecting member.

Preferably, at least two rubber suction cups may be provided on the two wafer carrying blades.

Preferably, each of the at least two rubber suction cups may comprise a rigid member, a flared rubber member surrounding the rigid member and a sealing sheet under the rigid member, wherein a vacuum channel is formed between the sealing sheet and the rigid member, and a through hole is formed in the rigid member to communicate with the vacuum channel.

Preferably, at least two of the dual-arm robot, the wafer-loading linear robot and the wafer-unloading linear robot may operate in parallel.

Preferably, the wafer transfer system may be capable of accommodating 2-, 3-, 4-, 5-, 6- and 8-inch wafers through adjusting a gap between the two wafer carrying blades of the fork.

Preferably, the dual-arm robot may be implemented as a cylindrical coordinate robot with two robotic arms.

Compared with the prior art, the invention has the following advantages:

1. Burden on the dual-arm robot is reduced because it does not need to directly transfer wafers with the wafer stage.
2. The wafer-loading and wafer-unloading linear robots are absent of vertical motion axle and are capable of wafer transfers with the wafer stage, the pre-alignment apparatus and the robot.
3. Time savings in the wafer transfers are achieved through loading a wafer on the wafer stage and unloading it therefrom by means of the wafer-loading and wafer-unloading linear robots.
4. The design of the forks of the wafer-loading and wafer-unloading linear robots allows accommodation of 2-, 3-, 4-, 5-, 6- and 8-inch wafers, bonded wafers and warped wafers.
5. The dual-arm robot, the wafer-loading linear robot and the wafer-unloading linear robot can operate in parallel so as to achieve further time savings in the wafer transfers.

In the figures, 100 denotes a dual-arm robot; 101, a main body; 102, a wafer loading arm; 103, a wafer unloading arm; 200, a wafer-loading linear robot; 300, a wafer-unloading linear robot;

301, a fork; 3011, wafer carrying blades; 3012, a connecting member; 3013, a connecting arm; 3014a, a rigid member; 3014b, a flared rubber member; 3014c, a sealing sheet; 3014d, a vacuum channel; 3014e, a through hole;

302, a stator of a linear motor; 303, a mover of the linear motor; 304, a slider; 305, a slide rail;

400, wafer storage apparatus; 500, a pre-alignment apparatus; 600, a wafer stage; 700, a buffer stage; and 800, a standby position.

DETAILED DESCRIPTION

Specific embodiments of the present invention will be described below in detail with reference to the accompanying drawings so that the above objects, features and advantages of the invention will be more readily apparent. It is noted that the drawings are provided in very simplified forms not necessarily presented to scale, with the only purpose of facilitating convenience and clarity in explaining the embodiments.

As shown in FIGS. 1 to 7, a wafer transfer system according to the present invention includes a dual-arm robot 100, a wafer-loading linear robot 200 and a wafer-unloading linear robot 300. The dual-arm robot 100 transfers a wafer to be exposed from a wafer storage apparatus 400 onto a pre-alignment apparatus 500 and places the exposed wafer from a buffer stage 700 back into the wafer storage apparatus 400. The wafer-loading linear robot 200 conveys the pre-aligned wafer onto a wafer stage 600, and the wafer-unloading linear robot 300 conveys the exposed wafer onto the buffer stage 700. Specifically, according to the present invention, the dual-arm robot 100 works together with the wafer-loading linear robot 200 and the wafer-unloading linear robot to circulate the wafer across the wafer storage apparatus 400, the pre-alignment apparatus 500, the wafer stage 600 and the buffer stage 700 with a shortened transfer cycle starting with the dual-arm robot 100 taking the wafer from the wafer storage apparatus 400 and ending with the dual-arm robot 100 returning the wafer into the wafer storage apparatus 400 and a higher wafer transfer yield. The process begins with a wafer loading arm (as detailed below) of the dual-arm robot 100 picking up a wafer to be exposed out of the wafer storage apparatus 400; the dual-arm robot 100 then approaches the buffer stage 700, and a wafer unloading arm (as detailed below) of the dual-arm robot 100 removes an exposed wafer from the buffer stage 700, positions the wafer to be exposed onto the pre-alignment apparatus 500 and puts the exposed wafer back to the wafer storage apparatus 400. The wafer-loading linear robot 200 is configured to place the pre-aligned wafer onto the wafer stage 600 for exposure. The wafer-unloading linear robot 300 is configured to position the exposed wafer on the buffer stage 700. This process is repeated without direct wafer transfers between the dual-arm robot 100 and the wafer stage 600. This simplifies the transfer operation of the robots and shortens its wafer circulation cycle time.

Figure 1:
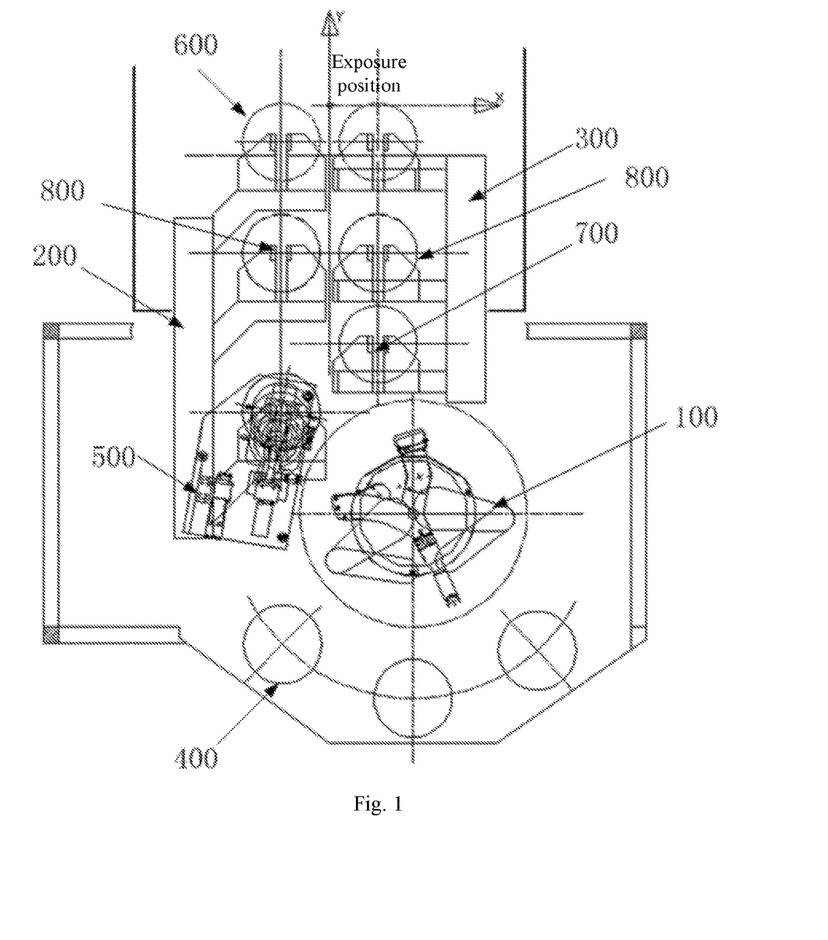
FIG. 1 is a structural schematic of a wafer transfer system according to a specific embodiment of the present invention.
Figure 2:
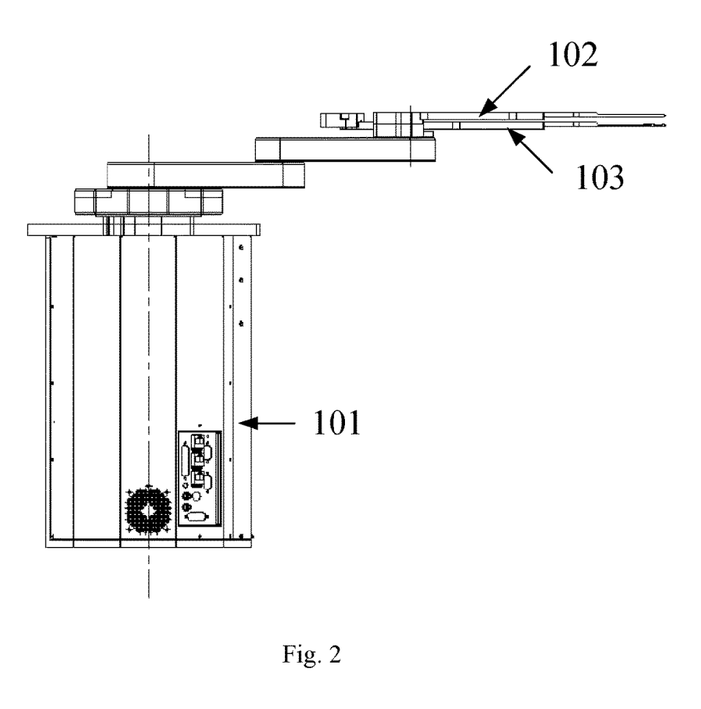
FIG. 2 is a structural schematic of a dual-arm robot in a wafer transfer system according to a specific embodiment of the present invention.

Referring with emphasis to FIG. 2, in conjunction with FIG. 1, according to the present invention, the dual-arm robot 100 is selected as a cylindrical coordinate robot with two robotic arms and configured for wafer circulation across the wafer storage apparatus 400, the pre-alignment apparatus 500 and the buffer stage 700. The dual-arm robot 100 includes: a main body 101 as well as a wafer loading arm 102 and a wafer unloading arm 103 both in movable connection with the main body 101. The loading and unloading arms 102,103 are identical and operate alternately to perform different tasks.

Figure 3:
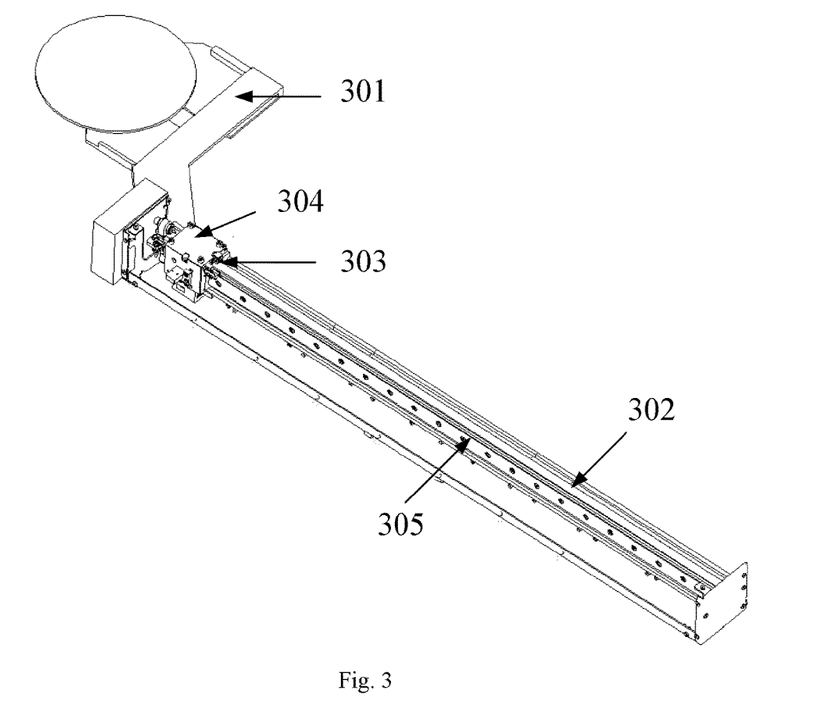
FIG. 3 is a structural schematic of a wafer-loading/unloading linear robot in a wafer transfer system according to a specific embodiment of the present invention.

Referring with emphasis to FIG. 3, in conjunction with FIG. 1, the wafer-loading linear robot 200 is configured to place the pre-aligned wafer onto the wafer stage 600, and the wafer-unloading linear robot 300 is configured to position the exposed wafer onto the buffer stage 700. According to the present invention, each of the wafer-loading linear robot 200 and the wafer-unloading linear robot 300 includes a fork 301, a linear motor and a slider 304. The linear motor includes a stator 302, a slide rail 305 and a mover 303. The slide rail 305 is provided on the stator 302, and the mover 303 drives the slider 304, and hence the fork 301 to move along the slide rail 305, so that the fork 301 is able to linearly translate in the horizontal direction.

Figure 4:
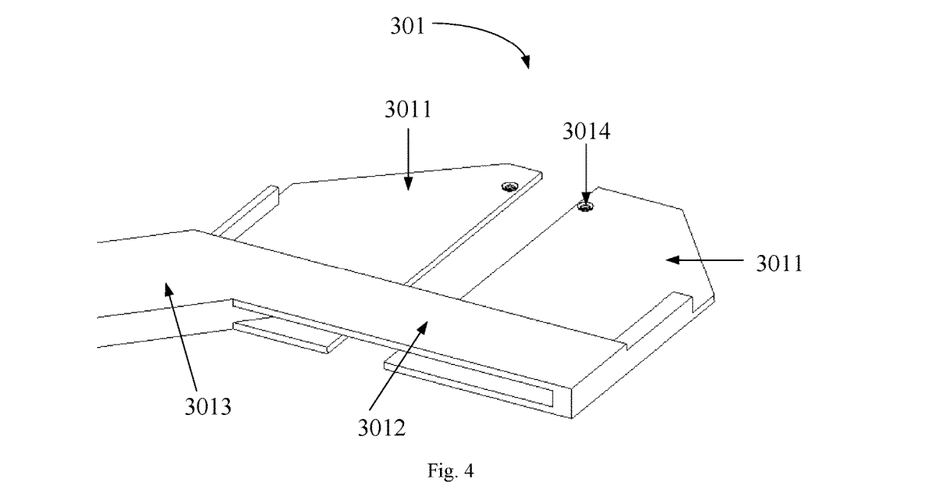
FIG. 4 is a structural schematic of a fork in a wafer transfer system according to a specific embodiment of the present invention.
Figure 5:
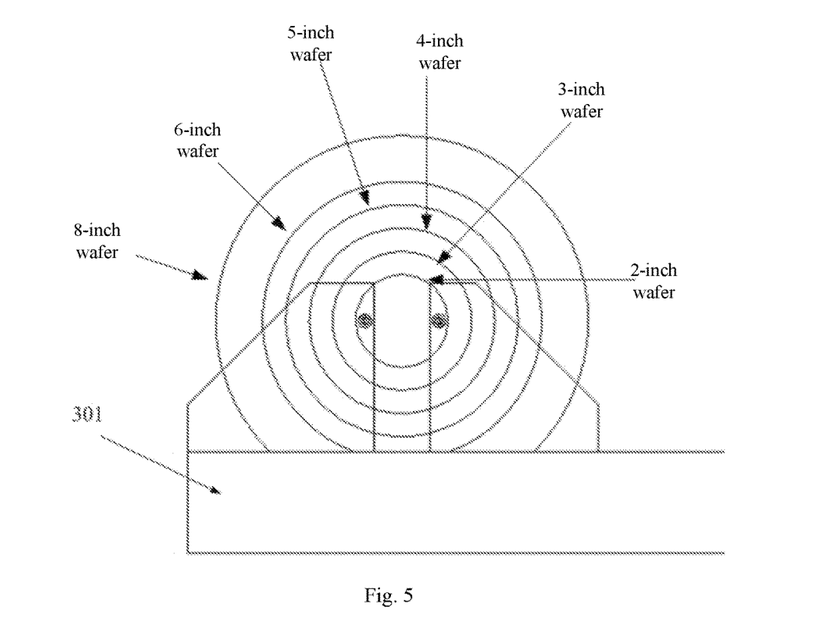
FIG. 5 schematically illustrates applications of a fork in a wafer transfer system according to a specific embodiment of the present invention.

Further, referring to FIG. 4, the fork 301 includes a connecting arm 3013 in fixed connection with the slider 304, a connecting member 3012 in fixed connection with the connecting arm 3013, and wafer carrying blades 3011 both fixed to the connecting member 3012 and arranged in symmetry with each other. Further, in order to facilitate the carrying of the wafer, each wafer carrying blade 3011 has an outer corner in the shape of a right-angled trapezium and another outer corner in the shape of a rectangle. Additionally, as shown in FIG. 5, a gap between the two wafer carrying blades 3011 is adjustable so that the fork 301 is able to carry 2-, 3-, 4-, 5-, 6- and 8-inch wafers, bonded wafers and warped wafers. That is, the fork 301 has high compatibility. On the wafer carrying blades 3011 are further provided with rubber suction cups 3014 for wafer retention. Preferably, the rubber suction cups 3014 are provided on near edges of the two wafer carrying blades 3011 in order to ensure their ability to retain wafers of various sizes.

Figure 6:
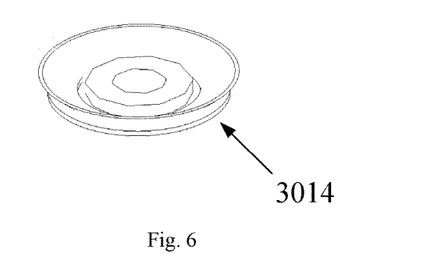
FIG. 6 is a three-dimensional view of a rubber suction cup in a wafer transfer system according to a specific embodiment of the present invention.
Figure 7:
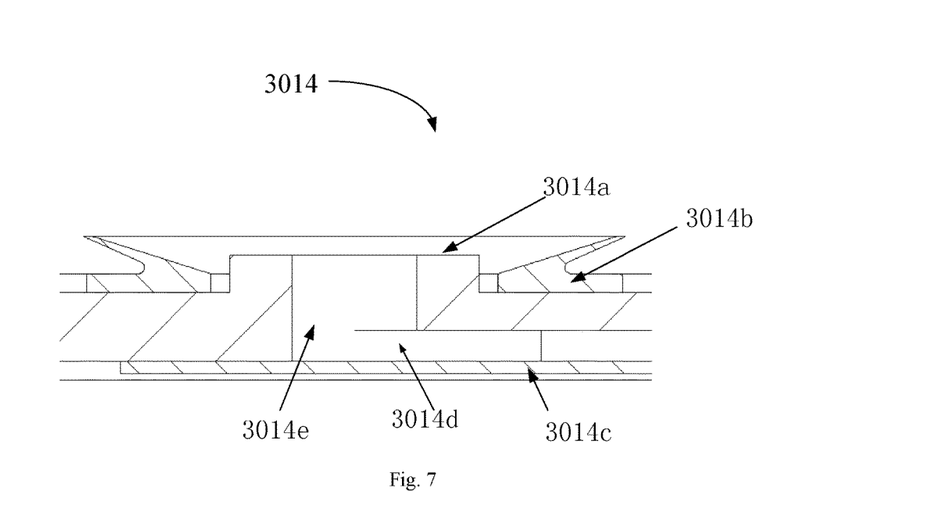
FIG. 7 is a structural schematic of a rubber suction cup in a wafer transfer system according to a specific embodiment of the present invention.

Referring with emphasis to FIGS. 6 and 7, each rubber suction cup 3014 includes a rigid member 3014a, a flared rubber member 3014b surrounding the rigid member 3014a, a sealing sheet 3014c under the rigid member 3014a, a vacuum channel 3014d between the sealing sheet 3014c and the rigid member 3014a, and a through hole 3014e so formed in the rigid member 3014a as to communicate with the vacuum channel 3014d.

Figure 8:
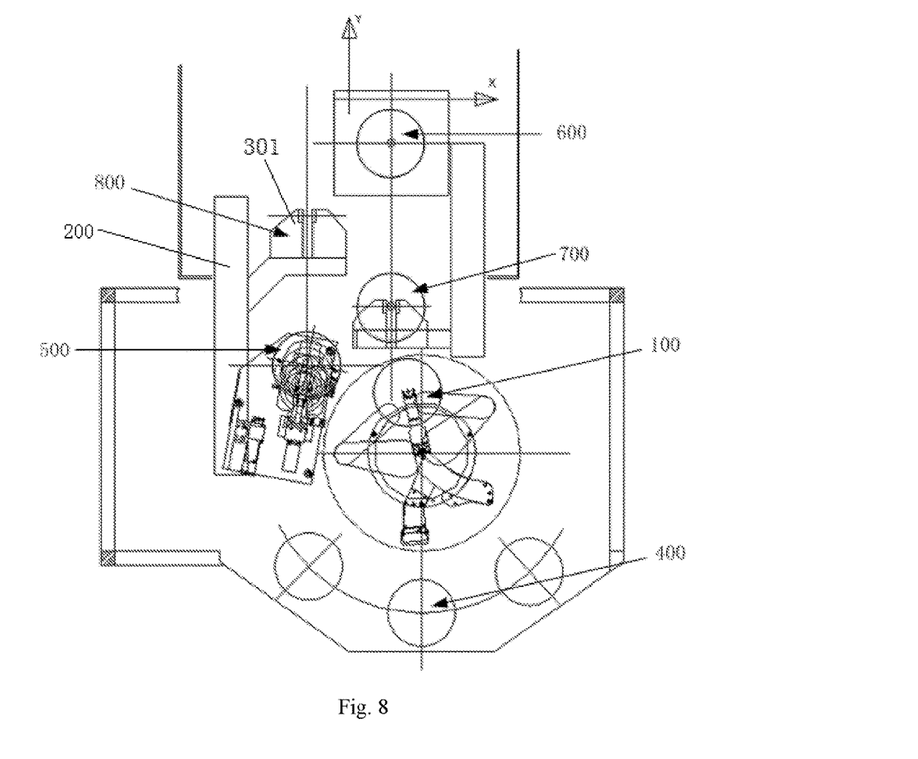
FIG. 8 schematically illustrates an initial state of a wafer transfer system according to a specific embodiment of the present invention.
Figure 9:
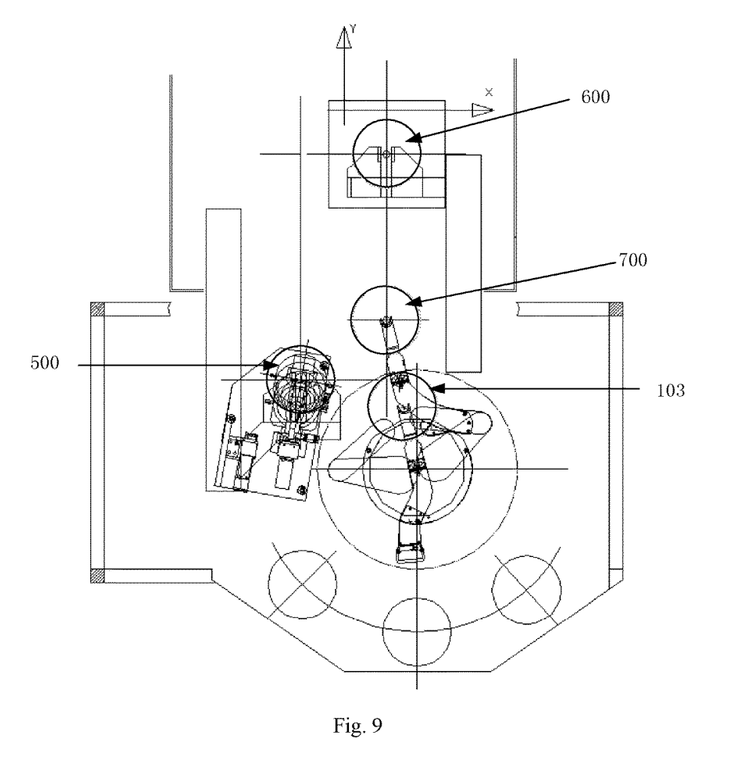
FIGS. 9 to 11 schematically illustrate wafer transfers performed by a wafer transfer system according to a specific embodiment of the present invention in different processes.
Figure 10:
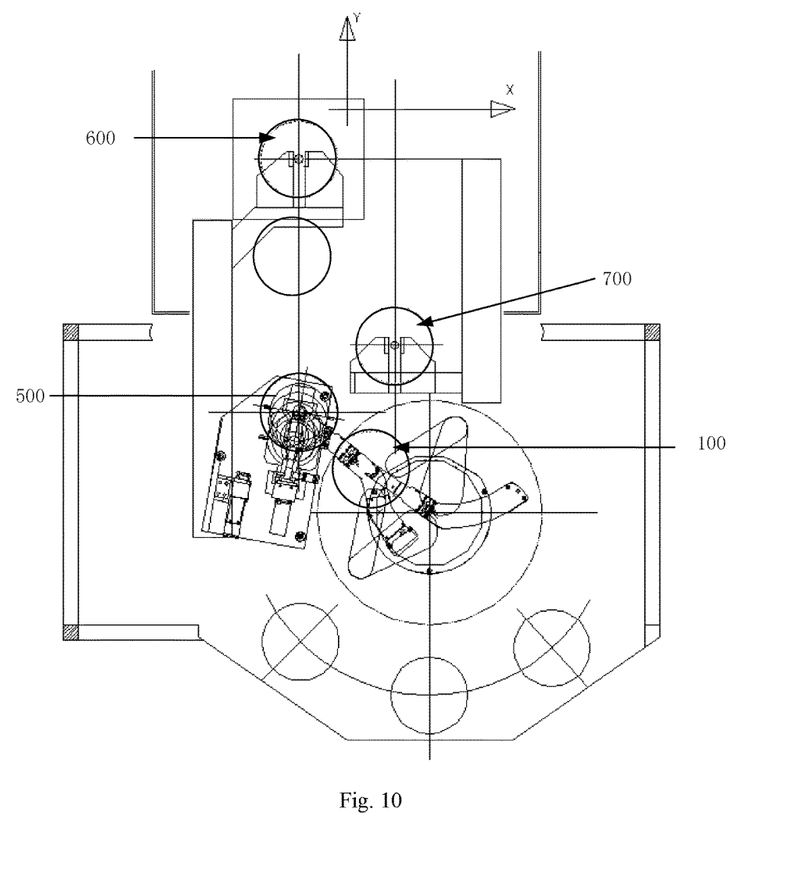

FIGS. 8 to 10 show an operating process of the wafer transfer system. As shown in FIG. 8, in an initial state of the wafer transfer system, an exposed wafer is carried on the buffer stage 700, in particular, at its wafer transfer position; there is no wafer on the wafer-loading linear robot 200, and its fork 301 is located at a standby position 800 for wafer reception; a pre-aligned wafer is placed on the pre-alignment apparatus 500, in particular, at an upper wafer transfer position thereof; the wafer loading arm 102 of the dual-arm robot 100 carries a wafer to be pre-aligned, while its wafer unloading arm 103 is empty and located at the buffer stage 700; another exposed wafer is positioned on the wafer stage 600, in particular, at its wafer transfer position.

As shown in FIG. 9, the wafer unloading arm 103 of the dual-arm robot 100 removes the exposed wafer from the buffer stage 700. Concurrently, the wafer stage 600 moves to its wafer unloading position. The wafer-unloading linear robot 300 moves to the wafer transfer position of the wafer stage 600 and removes the exposed wafer. The wafer-loading linear robot 200 moves to the wafer transfer position of the pre-alignment apparatus 500 and picks up the pre-aligned wafer.

Subsequently, as shown in FIG. 10, the wafer loading arm 102 of the dual-arm robot 100 moves to the wafer transfer position of the pre-alignment apparatus 500 and places the wafer to be pre-aligned thereon. Concurrently, the wafer stage 600 moves to its wafer loading position, and the wafer-loading linear robot 200 places the pre-aligned wafer onto the wafer stage 600. The wafer-unloading linear robot 300 conveys the exposed wafer onto the buffer stage 700.

Figure 11:
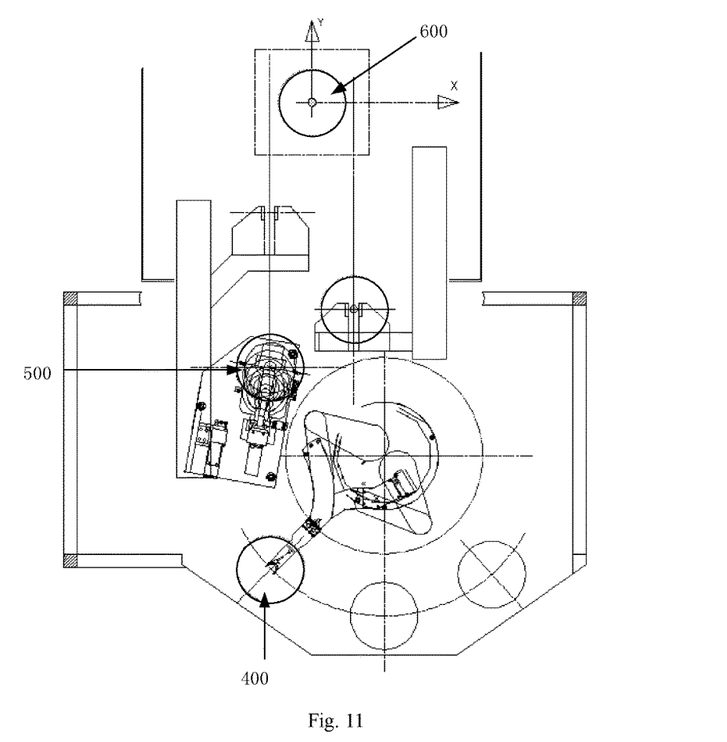

After that, as shown in FIG. 11, the wafer unloading arm 103 of the dual-arm robot 100 approaches the wafer storage apparatus 400 and puts the exposed wafer therein. The wafer loading arm 102 then arrives at the wafer storage apparatus 400 and takes a wafer to be pre-aligned from the wafer storage apparatus 400. Concurrently, the wafer stage 600 shifts to its exposure position to allow the wafer carried thereon to be exposed. The wafer-loading linear robot 200 moves to the standby position 800 and thus gets ready for wafer reception. The wafer-unloading linear robot 300 transfers the exposed wafer onto the buffer stage 700.

The operating process of the wafer transfer system may be designed according to the practical needs so as to shorten the times required for the wafer transfers. Table 1 summarizes various processes of the wafer transfer system as well as list the required times for each process performed by the dual-arm robot 100, the wafer-loading linear robot 200 and the wafer-unloading linear robot 300.

TABLE 1

Figure 12:
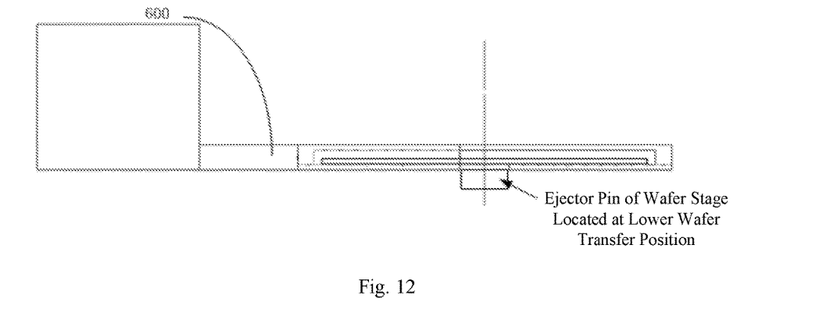
FIGS. 12 to 14 schematically illustrate an ejector pin of a wafer stage in a wafer transfer system according to a specific embodiment of the present invention at different positions.
Figure 13:
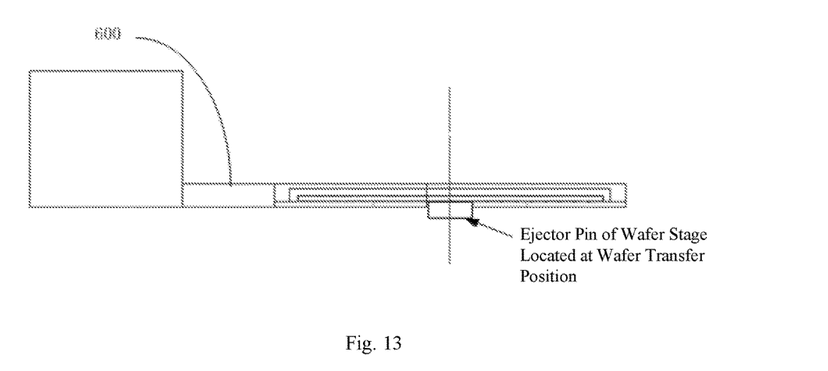
Figure 14:
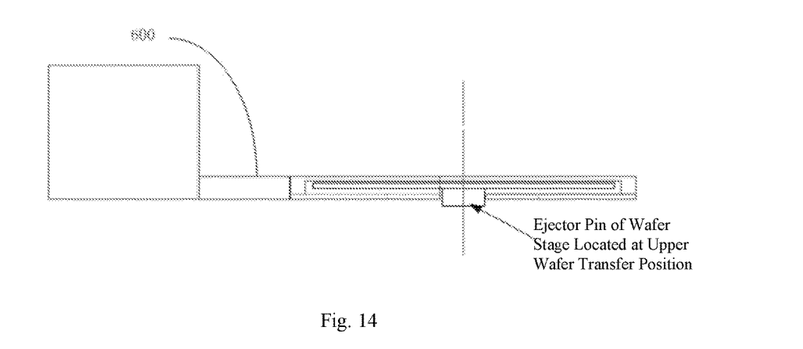

| No. | Action | Time | Parallel actions (wafer-unloading linear robot) | Parallel actions (wafer-loading linear robot) |
|---|---|---|---|---|
| 1 | wafer unloading arm 103 removes wafer from buffer stage 700 | 2 s | 1. Wafer stage 600 moves to wafer unloading position: 0.3 s; 2. Ejector pin of the wafer stage 600 lifts the wafer to the transfer position, as shown in FIG. 13: 0.5 s. | 1. Fork 301 of the wafer-loading linear robot 200 moves to standby position 800: 0.5 s; 2. Fork 301 of the wafer-loading linear robot 200 moves to transfer position of pre-alignment apparatus 500, followed by activation of vacuum: 0.5 s; 3. Pre-alignment apparatus 500 moves downward to its transfer position, followed by deactivation of vacuum: 0.5 s; 4. Pre-alignment apparatus 500 moves downward to its lower transfer position: 0.5 s; 5. Fork 301 of wafer-loading linear robot 200 moves to standby position: 0.5 s. |
| 2 | wafer loading arm 102 moves to wafer transfer position of the pre-alignment apparatus 500 | 1 s | 1. Fork 301 of wafer-unloading linear robot 300 moves to wafer unloading position, followed by activation of vacuum: 1 s; 2. Ejector pin cuts off vacuum and wafer stage 600 moves downward to lower transfer position, as shown in FIG. 12, followed by transfer of wafer onto fork 301 of wafer-unloading linear robot 300: 0.5 s. | |
| 3 | wafer loading arm 102 places wafer onto pre-alignment apparatus 500 | 2 s | 1. Wafer unloading arm 103 moves to wafer unloading position of buffer stage 700: 1 s; 2. Wafer stage 600 moves to its wafer loading position: 0.5 s. | 1. Vacuum is deactivated in the fork 301 of the wafer-loading linear robot 200: 0.2 s; 2. Ejector pin activates vacuum in wafer stage 600 and move upward to upper wafer transfer position, as shown in FIG. 14, followed by transfer of wafer onto ejector pin: 0.5 s; 3. Fork 301 of wafer-loading linear robot 200 is evacuated, and ejector pin moves |

TABLE 1-continued

| No. | Action | Time | Parallel actions (wafer-unloading linear robot) | Parallel actions (wafer-loading linear robot) |
|---|---|---|---|---|
| | | | | downward with the wafer into a safe space: 0.5 s; 4. Ejector pin of wafer stage 600 moves downward with the wafer until it is flush with surface of wafer stage 600: 0.5 s; 5. Wafer stage 600 moves to exposure position: 0.3 s. |
| 4 | wafer unloading arm 103 moves to wafer transfer position of the wafer storage apparatus 400 | 2.5 s | | |
| 5 | wafer unloading arm 103 places wafer into the wafer storage apparatus 400 | 2 s | | |
| 6 | wafer loading arm 102 approaches wafer storage apparatus 400 | 0.5 s | | |
| 7 | wafer loading arm 102 picks up a wafer from wafer storage apparatus | 2 s | | |
| 8 | wafer unloading arm 103 moves to wafer transfer position of the buffer stage 700 | 2.5 s | | |

As can be seen from Table 1, the wafer transfer system of the present invention enables a wafer transfer cycle of 14.5 s and a theoretical yield of 248 WPH, resulting in enhanced transfer efficiency and hence a higher yield of the photolithography tool in which the wafer transfer system is employed. According to the present invention, as there are no direct wafer transfers between the dual-arm robot 100 and the wafer stage 600, a time saving of 11.3 s is achieved. In addition, wafer loading from the dual-arm robot 100 onto the pre-alignment apparatus 500 is accomplished by the wafer loading arm 102 of the dual-arm robot 100, and wafer unloading from the pre-alignment apparatus 500 is accomplished by the wafer-loading linear robot 200, without involving the wafer unloading arm 103 of the dual-arm robot 100. This shortens the time required for wafer unloading from the pre-alignment apparatus by 3.7 s.

It is apparent that those skilled in the art can make various modifications and variations to the present invention without departing from the spirit and scope thereof. Accordingly, it is intended that all such modifications and variations are embraced in the scope of the invention if they fall within the scope of the appended claims and their equivalents.

What is claimed is:

1. A wafer transfer system for use in a photolithography system comprising a wafer storage apparatus, a pre-alignment apparatus, a buffer stage and a wafer stage, wherein the wafer transfer system comprises:
a dual-arm robot comprising a main body as well as a wafer loading arm and a wafer unloading arm both in movable connection with the main body, wherein the wafer loading arm is configured to take a wafer to be exposed from the wafer storage apparatus and transfer the wafer to be exposed onto the pre-alignment apparatus, the wafer unloading arm is configured to remove an exposed wafer from the buffer stage and place the exposed wafer back into the wafer storage apparatus;
a wafer-loading linear robot, configured to transfer a pre-aligned wafer onto the wafer stage; and
a wafer-unloading linear robot, configured to transfer the exposed wafer onto the buffer stage;
wherein each of the wafer-loading linear robot and the wafer-unloading linear robot comprises a fork, a linear motor and a slider, the linear motor comprises a linear motor stator, a slide rail and a linear motor mover, the slide rail is provided on the linear motor stator, the linear motor mover is configured to drive the slider, and hence the fork moves along the slide rail; and
wherein at least two dual-arm robots, the wafer-loading linear robot and the wafer-unloading linear robot operate in parallel.

2. The wafer transfer system of claim 1, wherein the fork is connected to a moveable end of the linear motor via the slider.

3. The wafer transfer system of claim 1, wherein the fork comprises a connecting arm in fixed connection with the slider, a connecting member in fixed connection with the connecting arm, and two wafer carrying blades symmetrically arranged and fixed to the connecting member.

4. The wafer transfer system of claim 3, wherein at least two rubber suction cups are provided on the two wafer carrying blades.

5. The wafer transfer system of claim 4, wherein each of the at least two rubber suction cups comprises a rigid member, a flared rubber member surrounding the rigid member and a sealing sheet under the rigid member, wherein a vacuum channel is formed between the sealing sheet and the rigid member, and a through hole is formed in the rigid member to communicate with the vacuum channel.

6. The wafer transfer system of claim 3, wherein the wafer transfer system is capable of accommodating 2-, 3-, 4-, 5-, 6- and 8-inch wafers through adjusting a gap between the two wafer carrying blades of the fork.

7. The wafer transfer system of claim 1, wherein the dual-arm robot is implemented as a cylindrical coordinate robot with two robotic arms.

* * * * *